(12) United States Patent
Kurosawa

(10) Patent No.: US 8,143,173 B2
(45) Date of Patent: Mar. 27, 2012

(54) METHOD FOR MANUFACTURING SEMICONDUCTOR DEVICE

(75) Inventor: Yasunori Kurosawa, Fujimi (JP)

(73) Assignee: Seiko Epson Corporation (JP)

( * ) Notice: Subject to any disclaimer, the term of this patent is extended or adjusted under 35 U.S.C. 154(b) by 377 days.

(21) Appl. No.: 11/942,809

(22) Filed: Nov. 20, 2007

(65) Prior Publication Data

US 2008/0119037 A1    May 22, 2008

(30) Foreign Application Priority Data

Nov. 22, 2006  (JP) ................................. 2006-315952
Nov. 7, 2007   (JP) ................................. 2007-289516

(51) Int. Cl.
*H01L 21/469* (2006.01)
*H01L 21/44* (2006.01)

(52) U.S. Cl. ........ 438/781; 438/780; 438/613; 438/612; 438/652; 438/674; 257/750; 257/739; 257/E21.476; 257/E23.021

(58) Field of Classification Search ........... 257/E21.476, 257/737, 738, E23.021, 750; 438/612, 613, 438/781, 780, 674, 652
See application file for complete search history.

(56) References Cited

U.S. PATENT DOCUMENTS

| 6,350,668 | B1 * | 2/2002 | Chakravorty | 438/612 |
| 6,977,435 | B2 * | 12/2005 | Kim et al. | 257/734 |
| 7,390,688 | B2 | 6/2008 | Wakabayashi et al. | |
| 2001/0026021 | A1 * | 10/2001 | Honda | 257/778 |
| 2002/0047133 | A1 * | 4/2002 | Nakahara et al. | 257/124 |
| 2006/0128134 | A1 * | 6/2006 | Baleras et al. | 438/612 |
| 2007/0018324 | A1 * | 1/2007 | Kwon et al. | 257/738 |

FOREIGN PATENT DOCUMENTS

| JP | 2000-332034 | 11/2000 |
| JP | 2001-250876 | 9/2001 |
| JP | 2004-134480 | 4/2004 |
| JP | 2004-179507 | 6/2004 |
| JP | 2004-241673 | 8/2004 |
| JP | 2006-229112 | 8/2006 |
| JP | 2007-115770 | 5/2007 |

* cited by examiner

*Primary Examiner* — Thanh V Pham
*Assistant Examiner* — Maria Ligai
(74) *Attorney, Agent, or Firm* — Harness, Dickey & Pierce, P.L.C.

(57) ABSTRACT

A method for manufacturing a semiconductor device includes: (a) forming a stress relaxation layer on a first surface having an electrode of a semiconductor substrate; (b) forming a wiring line so as to cover the electrode and the stress relaxation layer after step (a); (c) forming a solder resist layer on the wiring line after step (b); and (d) forming a protective layer on a second surface opposite to the first surface of the semiconductor substrate after step (c).

5 Claims, 5 Drawing Sheets

METHOD FOR MANUFACTURING SEMICONDUCTOR DEVICE

The entire disclosure of Japanese Patent Application No. 2006-315952, filed Nov. 22, 2006 and No. 2007-289516, filed Nov. 7, 2007 are expressly incorporated by reference herein.

BACKGROUND

1. Field of the Invention

Some aspects of the present invention relate to a method for manufacturing a semiconductor device.

2. Related Art

To cope with, the demand for miniaturization of semiconductor devices, processes have been developed in recent years to form a metal layer on the active face of a semiconductor wafer to make wiring lines or bumps. Thus, there are occasions where a thin semiconductor wafer is used to make a thinner semiconductor device. It is known that, in such cases, a resin layer is formed on the reverse face of a semiconductor wafer in order to reinforce the wafer.

JP-A-2000-332034 is one example of the related art.

In the related art, however, the metal layer on the active face may be damaged when the resin layer is formed on the reverse face of a semiconductor wafer, and a countermeasure is required against this problem.

SUMMARY

An advantage of some aspects of the invention is to prevent a metal layer formed on the active face of a semiconductor substrate from being damaged. A method for manufacturing a semiconductor device according to an aspect of the invention includes (a) forming a stress relaxation layer on a first surface of a semiconductor substrate on which an electrode is formed; (b) forming a wiring line so as to cover the electrode and the stress relaxation layer after step (a); (c) forming a solder resist layer on the wiring line after step (b); and (d) forming a protective layer on a second surface opposite to the first surface of the semiconductor substrate after step (c).

The method allows a metal layer to be protected by the solder resist layer and, thus, prevented from being damaged, because the metal layer is covered by the solder resist layer while the protective layer is formed.

In this aspect of the invention, the step (b) may include: (b-1) forming a conductive film so that the film covers the stress relaxation layer and the electrode; (b-2) forming a plating resist layer on the conductive film so that the plating resist layer has an opening that exposes a part of the conductive film; (b-3) forming a metal layer on the exposed part by electrolytic plating applying a current to the conductive film; (b-4) removing the plating resist layer; and (b-5) etching and removing the part by using the metal layer as a mask. The step (b) may be performed with a supporter on which the semiconductor substrate is placed so that the solder resist makes contact with the supporter.

In this aspect of the invention, the step (c) may further include forming, patterning, and curing a resin precursor layer so as to form the solder resist layer.

In this aspect of the invention, the step (c) may further include forming a first resin precursor layer as the solder resist layer and the first resin precursor layer may be patterned and cured after the step (d), and the step (d) may further include forming a second resin precursor layer as the protective layer and curing the second resin precursor layer while the first resin precursor layer is maintained in an uncured state.

In this aspect of the invention, a curing temperature of the first resin precursor layer may be higher than a curing temperature of the second resin precursor layer.

In this aspect of the invention, the step (c) may further include forming a first resin precursor layer as the solder resist layer, and the step (d) may further include forming a second resin precursor layer as the protective layer, and the first resin precursor layer and the second resin precursor layer may be simultaneously cured after the step (d).

In this aspect of the invention, a curing temperature of the first resin precursor layer may be equal to a curing temperature of the second resin precursor layer.

In this aspect of the invention, the method may further include providing an opening to the solder resist layer to expose the wiring line; and forming an external terminal made of solder in the opening. The forming of the external terminal is performed after the step (d).

A method for manufacturing a semiconductor device according to another aspect of the invention includes (a) forming a first resin layer on a first surface of a semiconductor substrate, the first surface of the semiconductor substrate having an electrode; (b) forming a wiring line on the electrode and the first resin layer after the forming of the first resin layer; (c) forming a second resin layer on the wiring line after the forming of the wiring line; and (d) forming a third resin layer on a second surface of the semiconductor substrate after the forming of the second resin layer, the second surface being opposite to the first surface.

This method allows the third resin layer to be formed while the wiring layer is covered by the second resin layer, thereby permitting the second resin layer to serve as the protective layer protecting the wiring layer when the third resin layer is formed, thus leading to prevention of damage caused on the wiring layer.

BRIEF DESCRIPTION OF THE DRAWINGS

The invention will be described with reference to the accompanying drawings, wherein like numbers reference like elements.

EXEMPLARY EMBODIMENTS OF THE INVENTION

Embodiments of the invention will be described.

First Embodiment

Referring to FIGS. 1A through 3, a method for manufacturing a semiconductor device according to a first embodiment of the invention will now be described. In the present embodiment, a semiconductor substrate (a semiconductor wafer made of silicon (Si), for example) 10 is used. Integrated circuits 19 are formed on the semiconductor substrate 10. To detail the description, the integrated circuits 19 are formed on one face of the semiconductor substrate 10 by a known semiconductor process. The integrated circuits 19 are fabricated into one surface layer of the semiconductor substrate 10. Furthermore, electrodes 12 are formed so as to be electrically coupled to the integrated circuits 19 through internal wiring formed in the semiconductor substrate 10. A passivation film 14 is formed in such a manner that the electrodes 12 are at least partly exposed. In other words, the exposed areas of the internal wiring connected from the integrated circuits 19, the areas being exposed from the passivation film 14, are the electrodes 12. The passivation film 14 may be formed with an inorganic material (e.g. an inorganic oxide such as Si).

Figure 1A:
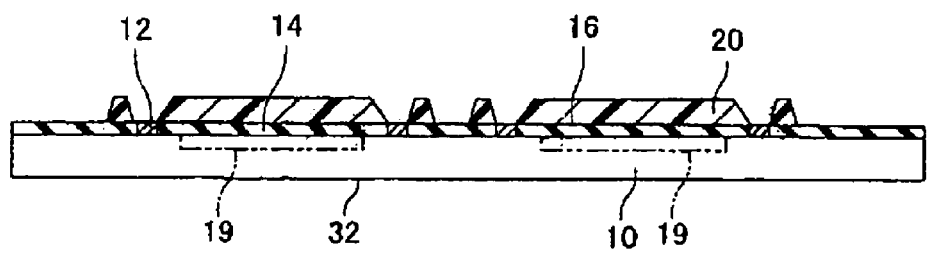
FIGS. 1A through 1F are diagrams describing a method for manufacturing a semiconductor device according to a first embodiment of the invention.

As shown in FIG. 1A, a stress relaxation layer 20 (in other words, first resin layer) is formed on a first face 16, having the electrodes 12, of the semiconductor substrate 10. The stress relaxation layer 20 is formed so as not to cover at least the electrodes 12 at least partly. For example, the stress relaxation layer 20 may be formed with a photosensitive resin by application of photolithography. Or, it may be formed using a thermosetting resin. The side faces of the stress relaxation layer 20 may be formed into slopes. The slopes are formed by thermal shrinkage of the precursor of the thermosetting resin. If the stress relaxation layer 20 is formed so as not to cover the cutting line, to be described later, of the semiconductor substrate 10, a cutter (or scriber) will be prevented from being clogged.

Figure 1B:
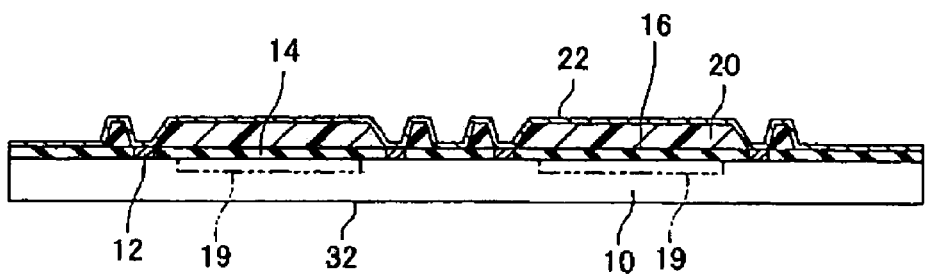

As shown in FIG. 1B, a conductive film 22 is formed so as to cover the stress relaxation layer 20 and the electrodes 12. The conductive film 22 may be formed on the passivation film 14 as well. The conductive film 22 includes at least one layer. It may be formed with a plurality of layers. For example, a foundation layer made of a mixture of titanium and tungsten may be first formed to be covered then by an epidermal layer made of a metal (e.g. copper) that is the same as the metal that forms a metal layer 28 that will be separated out by electrolytic plating, as described later.

Figure 1C:
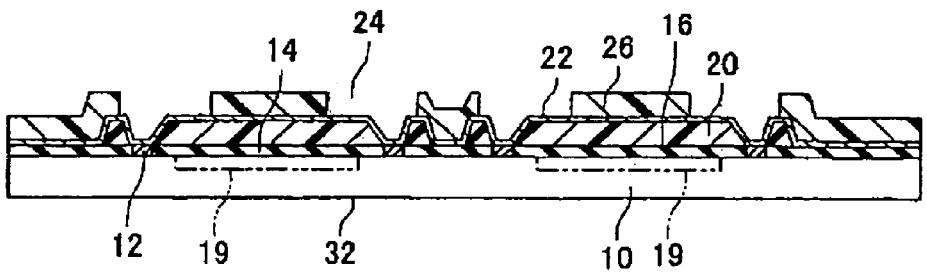

As shown in FIG. 1C, a plating resist layer 26 having openings 24 is formed on the conductive film 22 in such a manner that the openings 24 partly expose the conductive film 22. The openings 24 of the plating resist layer 26 expose the areas of the conductive film 22, covering the electrodes 12, while they also expose areas of the conductive film 22, extending in continuity from the areas on the electrodes 12 in the form of wiring. The plating resist layer 26 can be formed with a photosensitive resin. The photosensitive resin may be an ultraviolet setting resin, but a thermosetting resin can be cured more easily. The plating resist layer 26 is formed as follows: a resin precursor layer of the photosensitive resin is formed on the conductive film 22; openings 24 are formed in the resin precursor layer by photolithography that includes exposure and development; and the resin precursor layer is cured. As the layer of the photosensitive resin sets, the openings 24 may be made into a tapered shape that extends toward outside so that the inner side faces of the openings 24 become inclined. To put it otherwise, the apertural areas of the plating resist layer 26 may be smaller on its side facing the semiconductor substrate 10 than on the opposite side thereof.

Figure 1D:
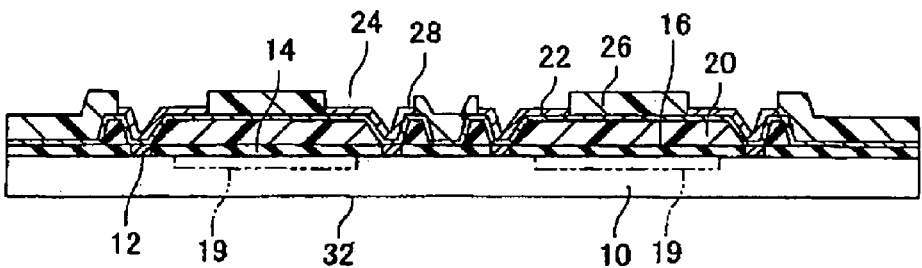

As shown in FIG. 1D, a metal layer 28 is formed on the areas of the conductive film 22 exposed from the plating resist layer 26 by electrolytic plating performed by flowing current in the conductive film 22. The conductive film 22 is used as electrode in the electrolytic plating. The metal layer 28 is a layer made of copper, for example. The metal layer 28 can be formed so that it fills the widths of the openings 24 if it is formed to have a height not exceeding the height of the plating resist layer 26, that is, if it is formed in such a manner that the metal layer 28 does not rise over the openings 24.

Figure 1E:
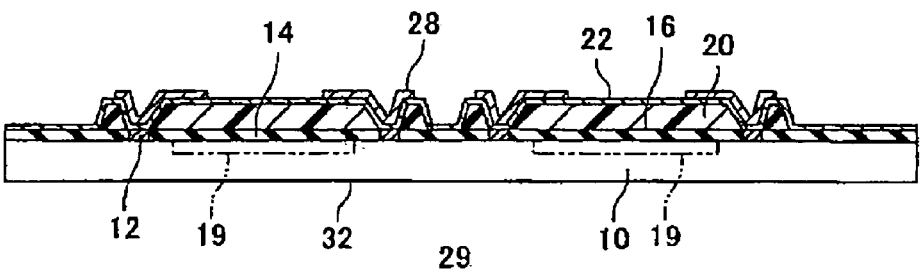

As shown in FIG. 1E, the plating resist layer 26 is removed.

Figure 1F:
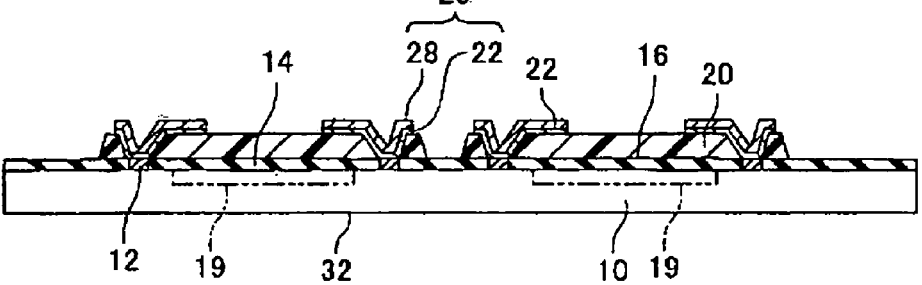

As shown in FIG. 1F, the areas of the conductive film 22 exposed from the metal layer 28 are removed by etching by using the metal film as a mask. This allows any damage caused on the metal layer 28 to be removed because the metal layer 28 is polished on surface by the etching procedure. The oxide film on the metal layer 28 can be removed as well. A wiring line 29 is formed by the metal layer 28 and the conductive film 22, and electrically coupled to the electrode 12. The wiring line 29 is not limited to the layer composed of the plurality of metals including the metal layer 28 and the conductive film 22, but may also be made of one layer of a metal as long as it is formed to cover the electrodes 12 and the stress relaxation layer 20.

Figure 2A:
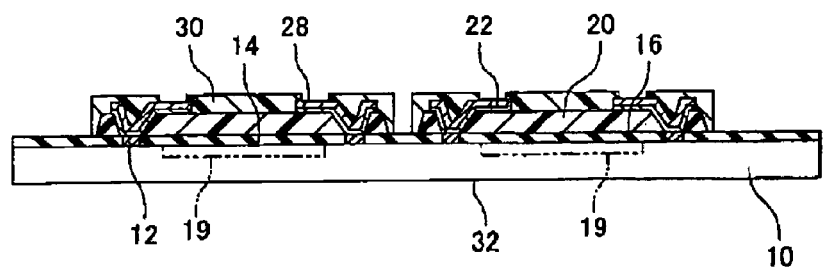
FIGS. 2A through 2C are diagrams describing the method for manufacturing a semiconductor device according to the first embodiment of the invention.

As shown in FIG. 2A, a solder resist layer 30 (in other words, a second resin layer) is formed. The solder resist layer 30 is formed in such a manner that it partly exposes the metal layer 28 (e.g. the land thereof) and covers all the other areas of the metal layer 28. The solder resist layer 30 may be placed also on the stress relaxation layer 20. However, if the solder resist layer 30 is formed so as not to cover the cutting line, to be described later, of the semiconductor substrate 10, a cutter (or scriber) will be prevented from being clogged. The solder resist layer 30 can be formed using a photosensitive resin that will be patterned and cured by a photolithographic process. In the case where a thermosetting resin is used to form the solder resist layer 30, the resin can be cured by heat. In the present embodiment, the solder resist layer 30 refers to a layer that has been cured.

Figure 2B:
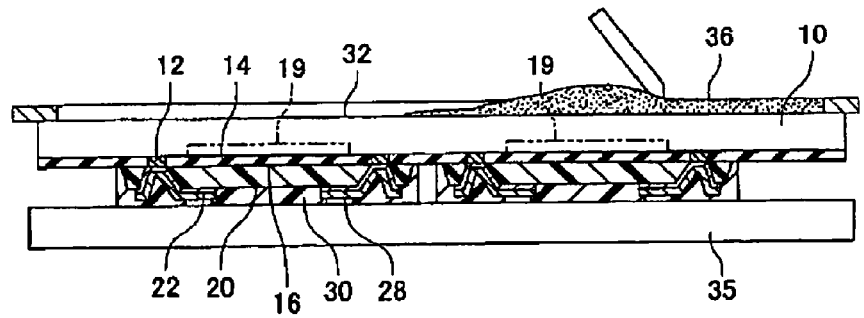
Figure 2C:
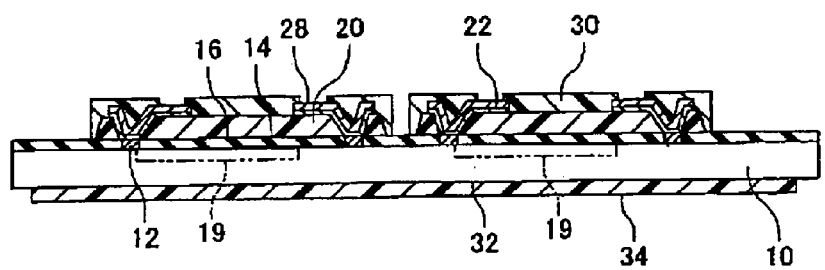

Next, a protective layer 34 (in other words, a third resin layer) is formed on a second face 32 opposite to the first face 16 of the semiconductor substrate 10. This step is performed using a supporter 35 in such a manner that the semiconductor substrate 10 is supported by, or placed on, the supporter. In more detail, the solder resist layer 30 is brought into contact with the supporter 35 in such a way that the first face 16 faces the supporter 35. Then, as shown in FIG. 2B, a resin precursor layer 36 is formed on the second face 32 thereof. The resin precursor may be an ultraviolet setting resin, but a thermosetting resin can be cured more easily. The resin precursor layer 36 can be formed with less waste of the material if screen printing is used, but this does not preclude use of the spin coat method. The resin precursor layer 36 is cured to form the protective layer 34 (see FIG. 2C). Alternatively, the protective layer 34 may also be provided by attachment of a tape or a sheet. Through provision of the protective layer 34, the second face 32 of the semiconductor substrate 10 can be protected and, also, the thin semiconductor substrate 10 can be reinforced. In the present embodiment, the metal layer 28 is covered by the solder resist layer 30 while the protective layer 34 is formed. Therefore, being protected by the solder resist layer 30, the metal layer 28 is prevented from being damaged.

Figure 3:
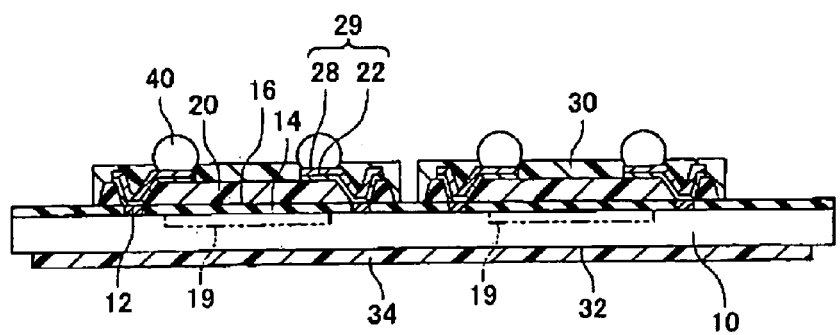
FIG. 3 is a diagram describing the method for manufacturing a semiconductor device according to the first embodiment of the invention.
Figure 4:
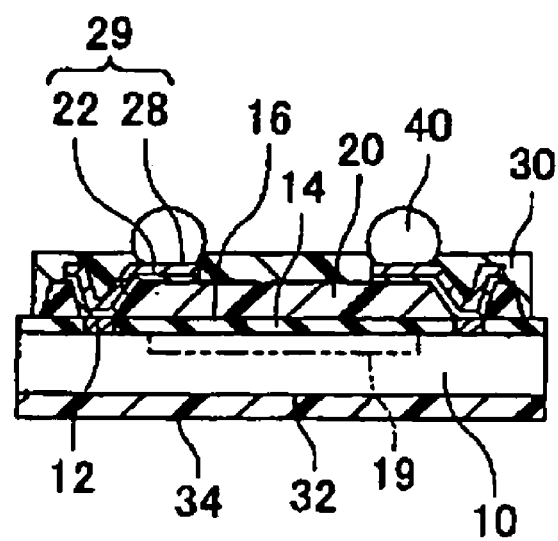
FIG. 4 is a diagram showing a semiconductor device manufactured by the method according to the first embodiment of the invention.

As shown in FIG. 3, external terminals 40 are formed on the metal layer 28. The external terminals 40 may be formed with solder. For example, they may be formed with cream solder provided on the metal layer 28, the cream solder being then melted to form balls by surface tension. In the present embodiment, the protective layer 34 is formed before the external terminals 40 are provided. Therefore, it is not necessary to devise a particular way to avoid affecting the external terminals 40 while the semiconductor substrate 10 is supported. This simplifies the process. Then, if the semiconductor substrate 10 is cut off (by dicing or scribing), a semiconductor device will be obtained, as shown in FIG. 4.

Second Embodiment

Referring to FIGS. 5A through 5D, a method for manufacturing a semiconductor device according to a second embodiment of the invention will now be described. In the present embodiment, the step shown in FIG. 5A will be performed after the steps shown in FIGS. 1A through 1F have been done.

Figure 5A:
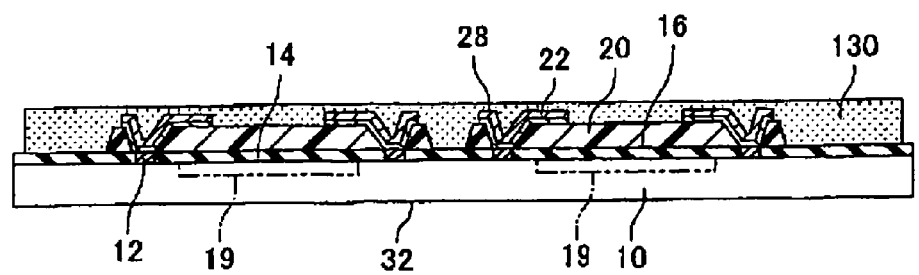
FIGS. 5A through 5D are diagrams describing a method for manufacturing a semiconductor device according to a second embodiment of the invention.

As shown in FIG. 5A, a first resin precursor layer 130 is formed as a solder resist layer. The present embodiment is different from the first embodiment in that formation (including curing) of the protective layer 34 is carried out before the first resin precursor layer 130 is patterned and cured. Accordingly, the solder resist layer referred to in the present embodiment is yet to be patterned and in an uncured state.

Figure 5B:
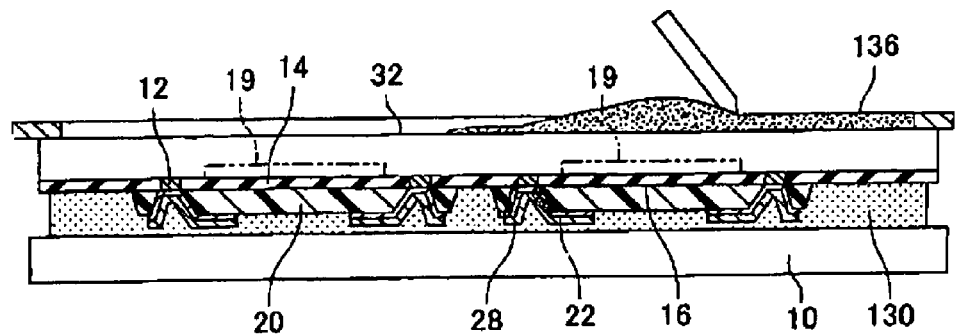
Figure 5C:
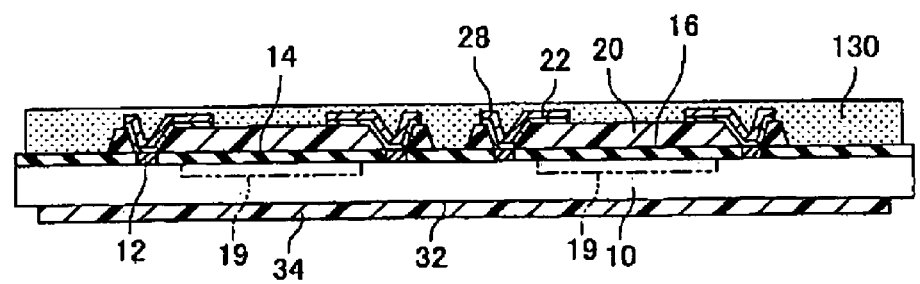

As shown in FIG. 5B, a second resin precursor layer 136 is formed to serve as the protective layer 34. The first resin precursor layer 130 is still in an uncured state at this point, but it may as well have been pre-baked to the extent that still allows it to be patterned. Then, the second resin precursor layer 136 is cured while the first resin precursor layer 130 is maintained in the uncured state (see FIG. 5C). For example, in the case where the first and the second resin precursor layers 130, 136 are both thermosetting resin precursors, a material that sets at a higher temperature than the material of the second resin precursor layer 136 is used for the first resin precursor layer 130.

Figure 5D:
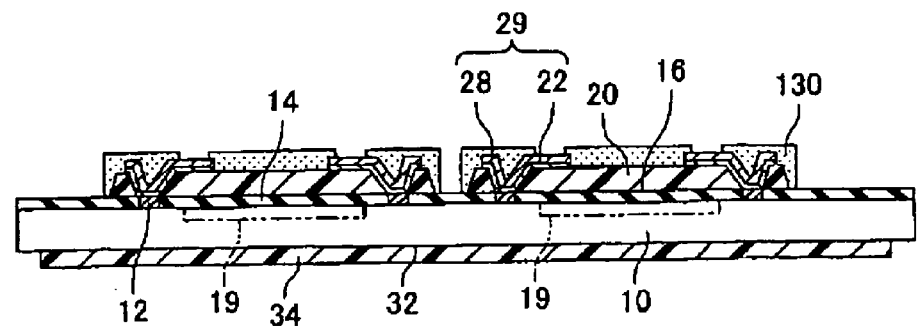

As shown in FIG. 5D, the first resin precursor layer 130 is patterned and cured (post-baking). For the rest of the process, description will be omitted because the description in the first embodiment applies also here and the effects are the same as well.

Third Embodiment

Figure 6A:
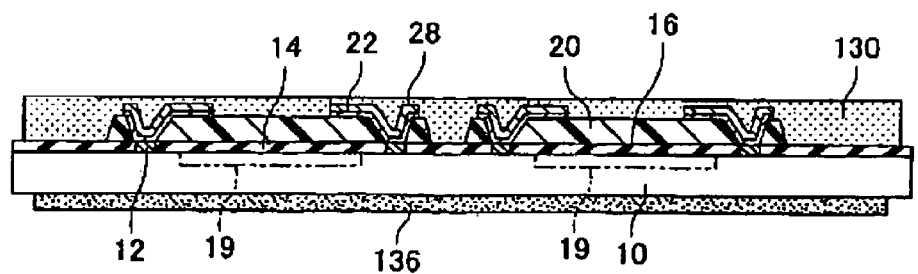
FIGS. 6A and 6B are diagrams describing a method for manufacturing a semiconductor device according to a third embodiment of the invention.
Figure 6B:
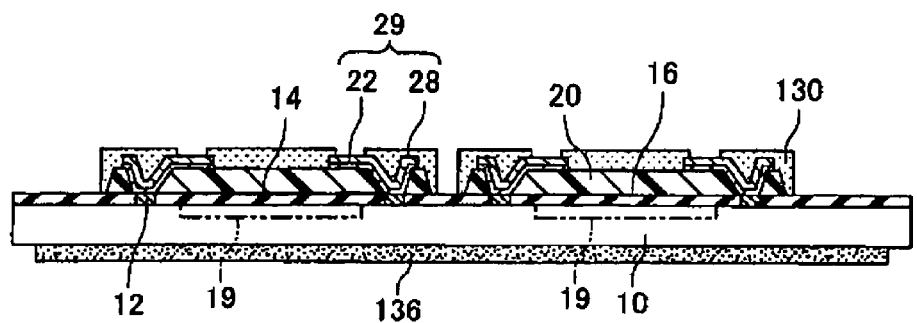

Referring to FIGS. 6A and 6B, a method for manufacturing a semiconductor device according to a third embodiment of the invention will now be described. In the present embodiment, the steps starting with the step shown in FIG. 6A are performed after the step in FIG. 5B has been carried out. Namely, the second resin precursor layer 136, to serve as the protective layer 34, is formed while the first resin precursor layer 130 is kept in an uncured state (see FIG. 6A). Furthermore, the first resin precursor layer 130 is patterned while the second resin precursor layer 136 is still uncured (see FIG. 6B). Then, the first and the second resin precursor layers 130, 136 are cured concurrently. The curing temperature may be the same for both the first and the second resin precursor layers 130, 136 since they are cured at the same time. The descriptions in the first and the second embodiments also apply for the rest of the process here and the effects are the same as well. Therefore, further description is omitted here.

The invention is not limited to the examples described above, but may be modified in a various ways. For example, the invention includes structures that are substantially the same (e.g. the same in function, method and result, or the same in purpose and result) as the structures described in the embodiments. The invention also includes structures that are the structures described in the embodiments, whose unessential parts, however, have been replaced. Moreover, the invention includes structures that provide the same effects or allow achievement of the same objective as the structures described in the embodiments. In addition, the invention also includes structures that are the structures described in the embodiments above, to which, however, heretofore known art is added.

What is claimed is:

1. A method for manufacturing a semiconductor device, comprising:
   (a) forming a stress relaxation layer on a first surface of a semiconductor substrate on which an electrode is formed;
   (b) forming a wiring line so as to cover the electrode and the stress relaxation layer after the step (a), wherein the step (b) includes:
      (b-1) forming a conductive film so that the conductive film contacts and completely covers the stress relaxation layer and the electrode;
      (b-2) forming a plating resist layer on the conductive film so that the plating resist layer has a first opening that exposes a first part of the conductive film;
      (b-3) forming a metal layer on the first part of the conductive film by electrolytic plating by applying a current to the conductive film;
      (b-4) removing the plating resist layer; and
      (b-5) etching a second part of the conductive film where the metal layer is not formed;
   (c) forming a first resin precursor layer as a solder resist layer on the wiring line after the step (b);
   (d) forming a second resin precursor layer as a protective layer on a second surface opposite to the first surface of the semiconductor substrate after the step (c), wherein the step (d) includes curing the second resin precursor layer while the first resin precursor layer is maintained in an uncured state, and wherein the step (d) is performed with a supporter on which the semiconductor substrate is placed so that the solder resist layer makes direct contact with the supporter;
   (e) providing a second opening in the solder resist layer to expose the wiring line; and
   (f) forming an external terminal made of solder in the second opening after the step (d), wherein:
   the first resin precursor layer is patterned and cured after the step (d).

2. The method for manufacturing a semiconductor device according to claim 1, wherein a curing temperature of the first resin precursor layer is higher than a curing temperature of the second resin precursor layer.

3. The method of manufacturing the semiconductor device according to claim 1, wherein the step (e) is performed after the step (d).

4. A method for manufacturing a semiconductor device, comprising:
   (a) forming a first resin layer on a first surface of a semiconductor substrate, the first surface of the semiconductor substrate having an electrode;
   (b) forming a wiring line on the electrode and the first resin layer after the forming of the first resin layer, wherein the step (b) includes:
      (b-1) forming a conductive film so that the conductive film contacts and completely covers the first resin layer and the electrode;
      (b-2) forming a plating resist layer on the conductive film so that the plating resist layer has a first opening that exposes a first part of the conductive film;
      (b-3) forming a metal layer on the first part of the conductive film by electrolytic plating by applying a current to the conductive film;
      (b-4) removing the plating resist layer; and (b-5) etching a second part of the conductive film where the metal layer is not formed;
(c) forming a second resin layer on the wiring line after the forming of the wiring line;
(d) forming a third resin layer on a second surface of the semiconductor substrate after the forming of the second resin layer, the second surface being opposite to the first surface, wherein the step (d) includes curing the third resin layer while the second resin layer is maintained in an uncured state, and wherein the step (d) is performed with a supporter on which the semiconductor substrate is placed so that the second resin layer makes direct contact with the supporter;
(e) forming a second opening in a first portion of the second resin layer, the first portion of the second resin layer being positioned on the wiring line; and
(f) forming an external terminal in the second opening after the step (d), wherein the second resin layer is patterned and cured after the step (d).

5. The method of manufacturing the semiconductor device according to claim 4, wherein the step (e) is performed after the step (d).

\* \* \* \* \*